SEMICONDUCTOR DEVICE

Filed Aug. 22, 1962 2 Sheets-Sheet 1

INVENTORS
HIROE OSAFUNE
ICHIEMON SASAKI
BY
ATTORNEY

SEMICONDUCTOR DEVICE

INVENTORS
HIROE OSAFUNE
ICHIEMON SASAKI
BY
Hopgood & Calimafde
ATTORNEY

United States Patent Office 3,193,740
Patented July 6, 1965

3,193,740
SEMICONDUCTOR DEVICE

Hiroe Osafune and Ichiemon Sasaki, Tokyo, Japan, assignors to Nippon Electric Company Limited, Tokyo, Japan, a corporation of Japan Filed Aug. 22, 1962, Ser. No. 218,608
Claims priority, application Japan, Sept. 16, 1961, 36/33,654
8 Claims. (Cl. 317—235)

This invention relates to semiconductor devices and particularly to such devices employed in electronic equipment of microminiature size.

At the present time, the components used in microminiature electronic equipment, such as resistors, capacitors, transistors, etc., are made individually and are then connected to each other, as for example by soldering or by printed circuit techniques in accordance with a circuit diagram. Accordingly, when the electronic equipments are manufactured by this conventional method, the minimum size which can be achieved for a particular item of equipment of a given design will be limited by a number of factors. One of these factors is the sizes of the individual components used, and considerable difficulty is experienced in making some of these components very small. Additionally, when each component is manufactured individually it must be connected together by wires and both the wires and the connections require the use of additional space. Furthermore the degree of reliability which can be achieved with such conventional construction is limited due to the possibility of failure of the connections between the various components.

Recently, attempts have been made to substantially reduce the size required for various components by forming a semiconductor body containing a number of p-n junctions arranged in such a manner as to produce at its terminals the electrical characteristics of a circuit equivalent to a circuit comprising a number of individual conventional components such as resistors, capacitors, etc. In these early efforts, however, a portion of the p-n junction exists at the surface of the semiconductor body. The junction, however, is very sensitive to the atmosphere and undesirable changes in the characteristics of the device result due to the effect of the atmosphere. The p-n junction can be covered with a suitable insulating material, however, this does not entirely eliminate changes in the characteristics due to the influence of the atmosphere.

Accordingly, it is an object of this invention to provide a unitary semiconductor structure of extremely small size having a plurality of contact areas which will provide between these areas electrical characteristics substantially identical to those of a conventional circuit comprising a plurality of components.

Figure 1:
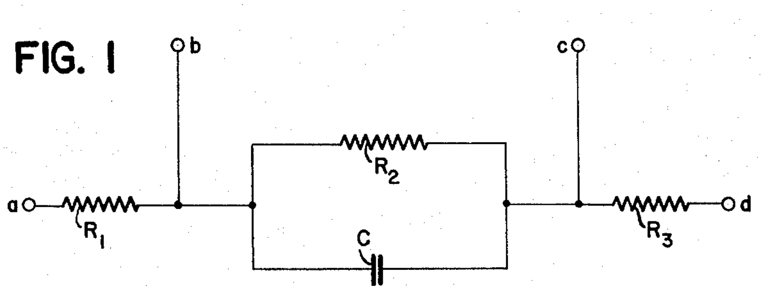
Figure 2:
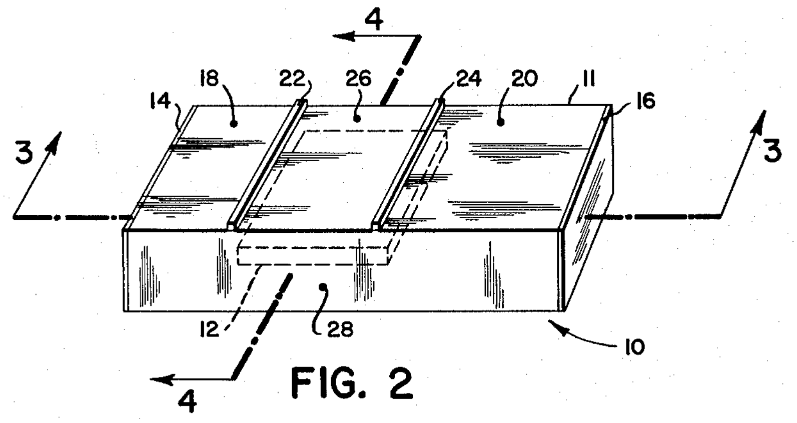
Figure 3:
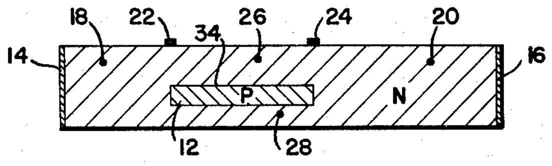
Figure 4:
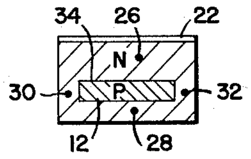
Figure 5A:
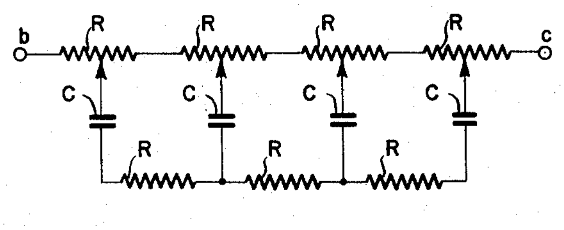
Figure 5B:
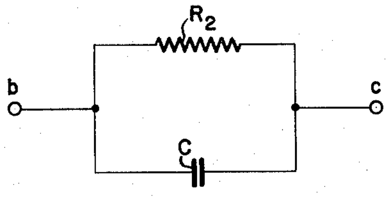
Figure 6A:
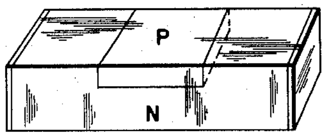
Figure 6B:
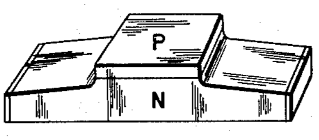
Figure 8:
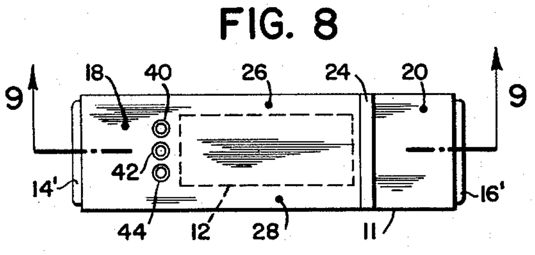
Figure 7:
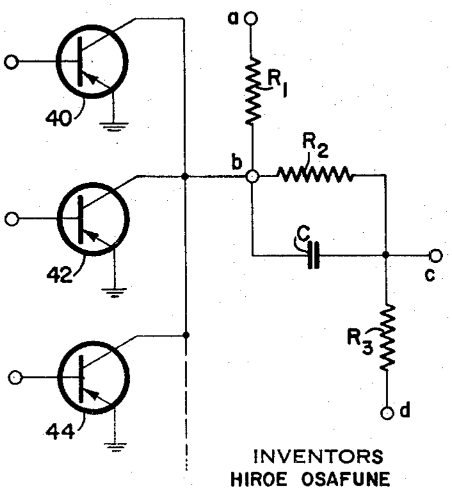
Figure 9:
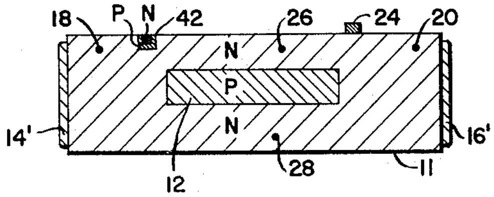

All of the objects, features and advantages and the invention itself will be best understood from a reading of the specification taken in conjunction with the accompanying drawings, in which FIGURE 1 shows an electrical circuit comprising a plurality of individual conventional components which are connected together by means of wires and soldered joints, FIGURE 2 is a perspective view of a unitary semiconductor structure or body made in accordance with this invention, FIGURE 3 is a cross-sectional view taken along the line 3—3 of FIGURE 2, FIGURE 4 shows a further cross-section of the device of FIGURE 2 taken along the line 4—4 thereof, FIGURE 5A shows a circuit illustrating the distribution resistance and capacity in the region of the p-n junction in FIGS. 2–4, FIGURE 5B illustrates the equivalent electrical circuit of FIGURE 5A, FIGURES 6A and 6B show perspective views of two types of prior art devices, FIGURE 7 is a logic circuit employing resistors, capacitors and transistors, FIGURE 8 is a plan view of a unitary semiconductor body similar to that shown in FIGURE 1 but modified to carry out the functions of all of the components shown in FIGURE 7, and FIGURE 9 is a cross-sectional view of the device shown in FIGURE 8 taken along the line 9—9 thereof.

The same numbers designate like parts in the various figures.

In accordance with one aspect of the invention a unitary structure or body of semiconductor material is provided in which a region of one conductivity type is totally encased or embedded within a larger portion of the body which is of an opposite conductivity type. A plurality of contact areas are provided on the surface of the body. The smaller portion of the conductivity regions is of predetermined position and size relative to the larger portion of the body in order to produce predetermined electrical characteristics between the contact areas.

In accordance with a further aspect of the invention the unitary semiconductor body is suitably modified to include at least one active element as an integral part of said body at a predetermined position therein.

Referring now to FIGURE 1 there is shown an electrical circuit comprising a plurality of passive components of the conventional type. This circuit forms a series arrangement comprising series resistors $R_1$ and $R_3$ and a parallel combination comprising the capacitor C and resistor $R_2$. The letters *a, b, c* and *d*, indicate various terminals of the circuit of FIGURE 1. The arrangement of FIGURE 1 is often employed as part of a logic or leveller circuit.

The circuit of FIGURE 1 may be formed entirely from a unitary semiconductor structure or body 10, see FIGURE 2. This body 10 comprises a block 11 of n-type conductivity and a smaller region 12 of p-type conductivity totally enclosed within the larger block 11. The conductivity regions may be reversed, that is, the conductivity region 12 may also if desired be of the n-type with the enclosing block 11 being of the p-type. In FIGURES 2, 3 and 4 the numerals 14 and 16 indicate areas of contact and correspond to the terminals *a* and *d* of FIGURE 1. Numerals 18 and 20 indicate regions of the block 11 corresponding respectively to resistors $R_1$ and $R_3$ of FIGURE 1. The resistance R of each portion 18 and 20 is determined by the formula $$\rho\frac{l}{tw}$$

where $\rho$ is the specific resistance of the semiconductor material, $l$ is the length of the portion of the material involved, $t$ is the thickness of the material, and $w$ is the width of the material. Terminals or contact areas preferably in the form of conductive strips 22 and 24 are provided on the top surface of the semiconductor body and correspond respectively to the terminals *b* and *c* of FIGURE 1.

The regions 26, 28, 30 and 32, see particularly FIGURE 4, comprise boundary regions, respectively, adjacent the top, bottom and sides of the enclosed p-type region 12. These regions 26, 28, 30 and 32 and the interface area 34 together make up the portion of the parallel circuit $R_2$–C, between the terminals *b* and *c*, of FIGURE 1.

The interface area 34, between the regions 12 and 26 is a p-n junction and therefore produces a capacitance, represented by the capacitor C in FIGURE 1. The capacitance at different points on the interface area will vary since a current passes through the region 26 and thereby creates a voltage differential. The capacitance distribution can be appreciated from the equivalent circuit shown in FIGURE 5A which represents the parallel circuit combination $R_2$–C between the terminals *b* and *c* of FIGURE 1. FIGURE 5B shows the circuit of FIGURE 5A in lump resistance and capacitor form, which of course corresponds to the parallel combination $R_2$–C between the terminals *b* and *c* of FIGURE 1. It should be noted that the p-type region just described is essential to the operation of the particular circuit under consideration.

Prior R–C circuit combinations were constructed in the manner shown in FIGURES 6A and 6B for example. In such prior devices only one side of the p-type region provides a junction with the n region and accordingly the junction capacity per unit length is approximately only half of that which can be achieved by encasing the region of one conductivity totally within the region of the other conductivity as described in accordance with the present invention.

The novel device described herein can be manufactured by first selectively diffusing a p-type impurity at a predetermined location on the surface of a body of n-type semiconductor material. This p-type impurity forms the region 12 in the drawings, which at this point borders on one surface of the n-type material 11 and is therefore exposed to the atmosphere. An n-type layer is then formed over this surface, thereby completely encasing the p-type region 12 within the n-type material.

FIGURE 7 shows a logic circuit in which three transistors 40, 42 and 44 are employed in combination with the circuit of FIGURE 1. In accordance with a further aspect of the invention the semiconductor body 10 of FIGURES 2, 3 and 4 is shown in FIGURE 8 modified to include the transistors 40, 42 and 44 of FIGURE 7 as an integral part of the body. These three transistors may be formed in accordance with known techniques. Referring again to FIGURE 7, each of the transistors 40, 42 and 44 has its collector portion connected to the terminal corresponding to the terminal *b* in FIGURE 1 and accordingly the strip terminal 22 is removed from the top of the body 10 and the three transistors are formed in this region instead. In the illustration these transistors are of the n-p-n type and accordingly the body 10 also forms the collector element of each transistor. Thus the entire circuit of FIGURE 7 is embodied in the unitary structure shown in FIGURES 8 and 9, the structure including both active elements in the form of transistors and passive elements in the form of resistors and a capacitor. Connections may be made to the emitter and base electrodes of the transistors 40, 42 and 44 in accordance with known techniques. Obviously diode or other semiconductor components could also be made in the unitary structure 10 in like manner as the transistors 40, 42 and 44 as dictated by particular circuit requirements.

It will be appreciated that since a region of one conductivity is totally enclosed within a region of the opposite type conductivity that the junction between them will not be exposed to the atmosphere and therefore there will be no changes in the electrical characteristics due to the atmosphere as in the case of the devices of the prior art. An additional advantage of the invention is that it is possible to achieve a capacitance figure of approximately twice that obtainable with the constructions of the prior art.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A unitary semiconductor wafer comprising an outer region of one conductivity type having a given resistivity and an inner region of opposite conductivity type totally enclosed within said outer region,
said inner region being generally in the shape of a wafer,
a pair of terminal area contacts disposed on generally opposed surfaces of said outer region, said contacts being arranged generally transverse to the longitudinal plane of said wafer,
the resistance of the portions of said outer region between said terminal area contacts and the corresponding end areas of said inner region being greater than the resistance of the portions of said outer region between the wafer major surfaces and the corresponding surfaces of said inner region,
and said inner region having a predetermined size and position with respect to said outer region to produce predetermined electrical characteristics of resistance and capacitance between said contacts.

2. The invention recited in claim 1 wherein said wafer comprises a body of generally elongated shape, the opposite ends of said body comprising regions having resistance characteristics and the region between said ends having the characteristics of a circuit comprising a resistor and a capacitor connected in parallel.

3. The invention as recited in claim 2 in which the portion of said wafer comprising said resistor and capacitor in parallel includes regions of conductivity of both the n-type and the p-type.

4. The invention recited in claim 1 which further includes a semiconductor diode formed at a surface of said wafer.

5. The invention as recited in claim 1 which further includes an active semiconductor component formed at a surface of said wafer.

6. The invention as recited in claim 5 in which said active component is a transistor.

7. The invention as recited in claim 6 wherein one electrode of said transistor is formed from a portion of said outer region of said wafer.

8. A unitary semiconductor wafer comprising
an outer region of one conductivity type and an inner region of opposite conductivity type entirely surrounded by said outer region.
said outer region having at least one dimension which is substantially greater than a dimension of said inner region in a corresponding direction,
said inner region being generally in the shape of a wafer,
a pair of spaced ohmic contacts located on a surface of said outer region to provide an electrical path through said outer region to said inner region,
and a pair of terminal area contacts disposed on generally opopsed surfaces of said outer region, said contacts being arranged generally transverse to the plane of said wafer,
the portions of said outer region between said inner region and said terminal area contacts each comprising a resistance element,
and the portion of said wafer between said resistance element portions having the characteristics of a circuit comprising a resistor connected in parallel with a capacitor.

References Cited by the Examiner

UNITED STATES PATENTS

| | | | |
|---|---|---|---|
| Re. 25,218 | 11/63 | Pfann | 317—235 |
| 2,954,486 | 9/60 | Doucette et al. | 317—235 |
| 2,985,804 | 5/61 | Buie | 317—235 |
| 3,007,090 | 10/61 | Rutz | 317—235 |
| 3,040,218 | 6/62 | Byczkowski | 317—234 |

DAVID J. GALVIN, *Primary Examiner.*

JAMES D. KALLAM, *Examiner.*